United States Patent (10) Patent No.: US 7,797,065 B2
Zaucha et al. (45) Date of Patent: Sep. 14, 2010

(54) AUTOMUTE DETECTION IN DIGITAL AUDIO AMPLIFIERS

(75) Inventors: David Edward Zaucha, Carrollton, TX (US); Venkateswar Reddy Kowkutla, Plano, TX (US); Anker Bjørn-Josefsen, Lynge (DK); Lars Risbo, København (DK); Douglas Allen Roberson, Rockwall, TX (US); Josey George Angilivelil, Sachse, TX (US)

(73) Assignee: Texas Instruments Incorporated, Dallas TX ( * ) Notice: Subject to any disclaimer, the term of this patent is extended or adjusted under 35 U.S.C. 154(b) by 1522 days.

(21) Appl. No.: 11/119,572

(22) Filed: May 2, 2005

(65) Prior Publication Data

US 2007/0005160 A1   Jan. 4, 2007

(51) Int. Cl.
*G06F 17/00* (2006.01)
*H03G 3/00* (2006.01)
*H03F 3/217* (2006.01)

(52) U.S. Cl. .................. 700/94; 381/107; 330/207 A (58) Field of Classification Search ......... 381/104–109, 381/94.5; 700/94; 330/10, 251, 207 A; 332/109–111
See application file for complete search history.

(56) References Cited

U.S. PATENT DOCUMENTS

| | | | | |
|---|---|---|---|---|
| 5,271,011 A | * | 12/1993 | McMullan et al. | 714/807 |
| 5,339,452 A | * | 8/1994 | Sugawara | 455/212 |
| 5,745,845 A | * | 4/1998 | Suenaga et al. | 455/194.1 |
| 5,805,020 A | * | 9/1998 | Danz et al. | 330/10 |
| 6,118,336 A | * | 9/2000 | Pullen et al. | 330/10 |
| 6,720,825 B2 | | 4/2004 | Hansen et al. | |
| 6,853,325 B2 | * | 2/2005 | Arizumi et al. | 341/152 |
| 6,988,116 B2 | * | 1/2006 | Corless et al. | 708/300 |
| 7,432,760 B2 | * | 10/2008 | Masuda et al. | 330/10 |
| 2004/0017854 A1 | | 1/2004 | Hansen et al. | |
| 2005/0076073 A1 | | 4/2005 | Gurrapu | |
| 2005/0083115 A1 | * | 4/2005 | Risbo | 330/10 |

* cited by examiner

*Primary Examiner*—Vivian Chin
*Assistant Examiner*—Daniel R Sellers
(74) *Attorney, Agent, or Firm*—John J. Patti; Wade J. Brady, III; Frederick J. Telecky, Jr.

(57) ABSTRACT

A digital audio processor for a digital audio receiver having an improved automute sequence is disclosed. The digital audio processor includes automute detection circuitry that monitors the amplitude of digital audio signals before and after the application of digital filters by digital audio processing circuitry. The amplitude of the input signals are compared against a first threshold level, while the amplitude of the output signals are compared against a second threshold level. In response to the amplitude of the input signals for all of the audio channels falling below the first threshold for a selected time period, a gain stage in each channel ramps down the volume to a mute level, and pulse-width-modulation circuitry is disabled. If the output signal amplitude falls below a second threshold for a channel, the pulse-width-modulation circuitry for that channel is disabled. Hysteresis for the input signal amplitude is preferably added into the automute exit determination.

13 Claims, 5 Drawing Sheets

AUTOMUTE DETECTION IN DIGITAL AUDIO AMPLIFIERS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of digital audio amplifiers, and is more specifically directed to noise reduction in pulse-width-modulation type class D audio power amplifiers.

In recent years, digital signal processing techniques have become prevalent in many electronic systems. Tremendous increases in the switching speed of digital circuits have enabled digital signal processing to replace, in large part, analog circuits in many applications. For example, the sampling rates of modern digital signal processing are sufficiently fast that digital techniques have become widely implemented in audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD and plasma televisions, and DVD receivers. The ability to realize the audio output amplifier in CMOS has also enabled integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

By way of further background, a particular problem in class D audio amplifiers is presented by the transient events of muting and un-muting of the audio system. As is fundamental in the art, a steady-state square wave time-domain signal (corresponding to a 50% duty cycle PWM signal) transforms into the frequency domain as discrete frequency components at the fundamental "carrier" frequency and its harmonics. It has been observed that if the PWM signal is abruptly gated on or off or otherwise abruptly changes its duty cycle, however, significant energy is present in sidebands to the carrier frequency and its harmonics. And even if the fundamental frequency is relatively high, the abrupt gating on or off of the PWM signal can result in sidebands with significant energy that extend into audible frequencies, which manifest as audible "clicks" or "pops". In audio systems, this gating on and off of the PWM output occurs when the user mutes or unmutes the audio output, and at power-up and power-down, in which case the audible clicks and pops are very undesirable.

Known analog techniques for reducing clicks and pops in analog audio amplifiers include smoothing the change in biasing, for example at power-up. However, these smooth biasing changes cannot be directly applied in class D amplifiers, because these amplifiers operate by way of PWM switching of the output transistors. According to another conventional analog approach, clicks and pops are reduced by introducing a switch or relay that disconnects the load during mode changes, thus eliminating transients from appearing at the load; however, the insertion and control of such a switch or relay has proven to be cost-prohibitive, especially in modern systems.

Considering that class D audio amplifiers effectively operate in the digital realm, and also considering that many sources of audio input signals are also digital in nature (e.g., compact discs, MP3 and other digitally compressed music files, satellite radio), many modern audio systems are fully digital, in that they receive digital input signals and produce digital, PWM, class D amplifier output. In these fully digital systems, digital signal processing techniques for suppressing clicks and pops are known.

One digital technique for suppressing clicks and pops relies upon the generation of a specific sequence of PWM signals that are designed to cancel out audible frequencies that result from the starting or stopping of the PWM output, as described in U.S. Pat. No. 6,720,825, assigned to Texas Instruments Incorporated and incorporated herein by this reference. Audible noise reduction by stopping a noise-shaped signal at a favorable time, by monitoring the digital output of a noise shaping filter in a digital audio system, is described in U.S. Patent Application Publication No. US 2004/0017854, which is assigned to Texas Instruments Incorporated and incorporated herein by this reference. Another approach to reduction of clicks and pops involves the insertion of inter-channel delay among multiple channels in a digital audio system, as described in copending application Ser. No. 10/988,268 filed Nov. 12, 2004 entitled "On-the-Fly Introduction of Inter-Channel Delay in a Pulse-Width-Modulation Amplifier", assigned to Texas Instruments Incorporated and incorporated herein by this reference. In this approach, the inter-channel delay is designed to reduce switching noise between the pulse-width-modulated outputs, reduce cross-talk among the multiple channels, and generally provide significant improvement in system performance. These digital techniques have proven valuable in eliminating audible transient effects in digital amplifiers.

The so-called "automute" feature is also important in avoiding unpleasant audible noise, as known in the art. In typical class D digital audio amplifiers, a zero amplitude audio signal is reflected as a 50% duty cycle in the PWM output, which dissipates energy and also generates audible idle noise. According to conventional automuting techniques, the digital output is forced to zero in response to the audio signal having an amplitude below a certain low threshold level for a certain duration. Rapid entry into and exit from the automute state is of course desired for good system performance. However, typical modern audio amplifiers include low frequency filters that, as a result, necessarily have long energy storage times. These energy storage times are longer than the desired response timing for entering the automute state. If the automute state is entered rapidly while energy remains in the filters, however, the resulting transients will generate substantial noise in audible frequencies.

BRIEF SUMMARY OF THE INVENTION

It is therefore an object of this invention to provide a digital audio amplifier system that can rapidly automute and unmute without generating substantial audible noise.

It is a further object of this invention to provide such a system that is compatible with low frequency, long time constant, filters.

It is a further object of this invention to provide such a system that can adapt and adjust to various clock frequencies and sampling rates without generating audible artifacts at the output.

It is a further object of this invention to provide such a system that avoids false automute triggering while avoiding oscillations into and out of automute.

It is a further object of this invention to provide such a system that provides additional degrees of freedom in controlling and optimizing the performance of the automute function.

Other objects and advantages of this invention will be apparent to those of ordinary skill in the art having reference to the following specification together with its drawings.

The present invention may be implemented into a digital audio amplifier that includes a first volume detector to detect the input signal prior to digital audio processing, and a second volume detector to detect the signal volume after digital audio processing, the digital audio processing including digital filters of relatively long time constants. Logical combining the results of the first and second volume detectors permit muting of the audio output abruptly if the filter output is sufficiently low, and rapid but smooth and noise-free muting in response to the input signal having a sufficiently low amplitude while energy still remains in the digital audio processing filters.

DETAILED DESCRIPTION OF THE INVENTION

This invention will be described in connection with its preferred embodiment, namely as implemented into a digital audio receiver, or into the digital audio processing circuitry of a digital audio-video receiver, because it is contemplated that this invention is especially beneficial in such an application. However, it is also contemplated that this invention can also be advantageously used in other systems and applications, including such applications as digital audio recording, other digital audio processing applications, and the like. Accordingly, it is to be understood that the following description is provided by way of example only, and is not intended to limit the true scope of this invention as claimed.

Figure 1:
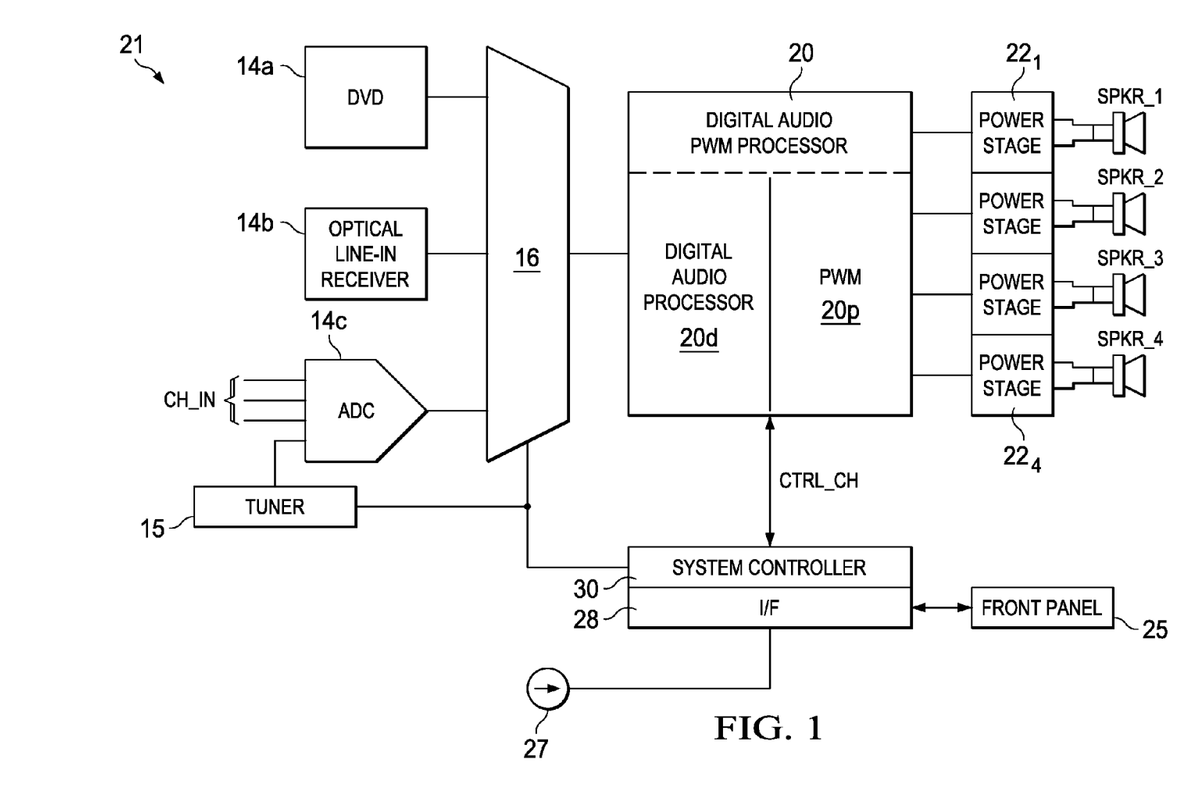
FIG. 1 is an electrical diagram, in block form, of a digital audio or audio-visual receiver constructed according to the preferred embodiment of the invention.

Referring first to FIG. 1, the construction of audio processing circuitry in digital audio-visual receiver 21 according to the preferred embodiment of the invention will now be described. The video data paths in digital audio-visual receiver 21 are not shown for the sake of clarity of this description. In the example of receiver 21, multiple sources of audio signals are available to receiver 21, and may be processed into output audio by digital audio decoder and processor 12. Multiplexer 16 receives digital audio from DVD controller 14a, such audio corresponding to audio content from DVD movies, or audio contents from a CD, either being played on a DVD player (not shown) to which receiver 21 is connected. Optical line-in receiver 14b provides digital audio, for example from satellite or cable television sources, to another input of multiplexer 16. Analog-to-digital converter (ADC) 14c converts analog stereo signals from analog line-in inputs CH_IN and from tuner 15 to a digital datastream, and provides this datastream to another input of multiplexer 16. Multiplexer 16 chooses from among these inputs, and inputs from other sources if available, for application to digital audio PWM processor 20, under the control of system controller 30. The selection of audio source effected by multiplexer 16 is under user control; in this regard, system controller 30 receives direct selection inputs from front panel switches 25 of receiver 21, or infrared remote control signals via infrared receiver 27, both communicating with system controller 30 via interface circuitry 28.

It is contemplated that the digital data applied by multiplexer 16 to digital audio PWM processor 20 will be in the form of a datastream of parallel data words, for example a word width of twenty-four bits for each channel. As such, it is contemplated that either the particular audio sources 14a through 14c will present the datastream in this format, or alternatively circuitry will be provided at multiplexer 16 or otherwise to reformat the digital data from sources 14a through 14c (e.g., in the form of one-bit datastreams) into parallel data words.

In a general sense, digital audio PWM processor 20 includes digital audio processing function 20d and pulse-width-modulation (PWM) function 20p. In general, digital audio processing function 20d digitally processes digital audio signals according to a sequence of functions including digital mixing, channel equalization, treble and bass control, soft volume, loudness compensation, dynamic range compensation, and the like. As mentioned above, and as will be described in further detail below, these digital audio processing operations are typically executed by way of digital filters. The output of digital audio processing function 20d is forwarded to PWM function 20p, for example in the form of pulse-code-modulated (PCM) digital words. PWM function 20p applies noise-shaping to the PCM signals, and converts the noise-shaped PCM digital audio signals to corresponding pulse-width-modulated (PWM) output signals. In this example, PWM function 20p produces, for each of the four supported channels, separate PWM control signals that are applied to a corresponding power stage $22_1$ through $22_4$, each of which drives a respective one of loudspeakers SPKR_1 through SPKR_4. Of course, more or fewer audio channels may be driven by receiver 21. In a simple stereo arrangement, only two channels may be processed; alternatively, as many as eight audio channels are now commonly handled by digital audio-visual receivers such as receiver 21. The number of channels supported and utilized by receiver 21 is a matter of choice for the designer and the user.

According to this embodiment of the invention, digital audio PWM processor 20, including both of the functions of digital audio processing function 20d and PWM function 20p, along with the appropriate support controller and other circuitry, is preferably realized in a single integrated circuit. Alternatively, the two functions of digital audio processing function 20d and PWM function 20p may be realized in separate integrated circuits from one another. In either case, it is contemplated that those skilled in the art, having reference to this specification including the detailed description of the construction and operation of digital audio PWM processor 20 provided below, will be able to realize this invention in a suitable manner for a specific application, without undue experimentation.

As mentioned above, system controller 30 provides audio source selection signals to multiplexer 16. In addition, system controller 30 provides other control signals throughout receiver 21, including channel selection control to tuner 15 in response to user inputs received via front panel 25 or infrared receiver 27, and system control to digital audio PWM processor 20. In this example, control signals or data are provided by system controller 30 to digital audio PWM processor 20 over control channel CTRL_CH, which is preferably implemented as a digital serial interface, such as an I²C serial interface, as well known in the art.

Figure 2:
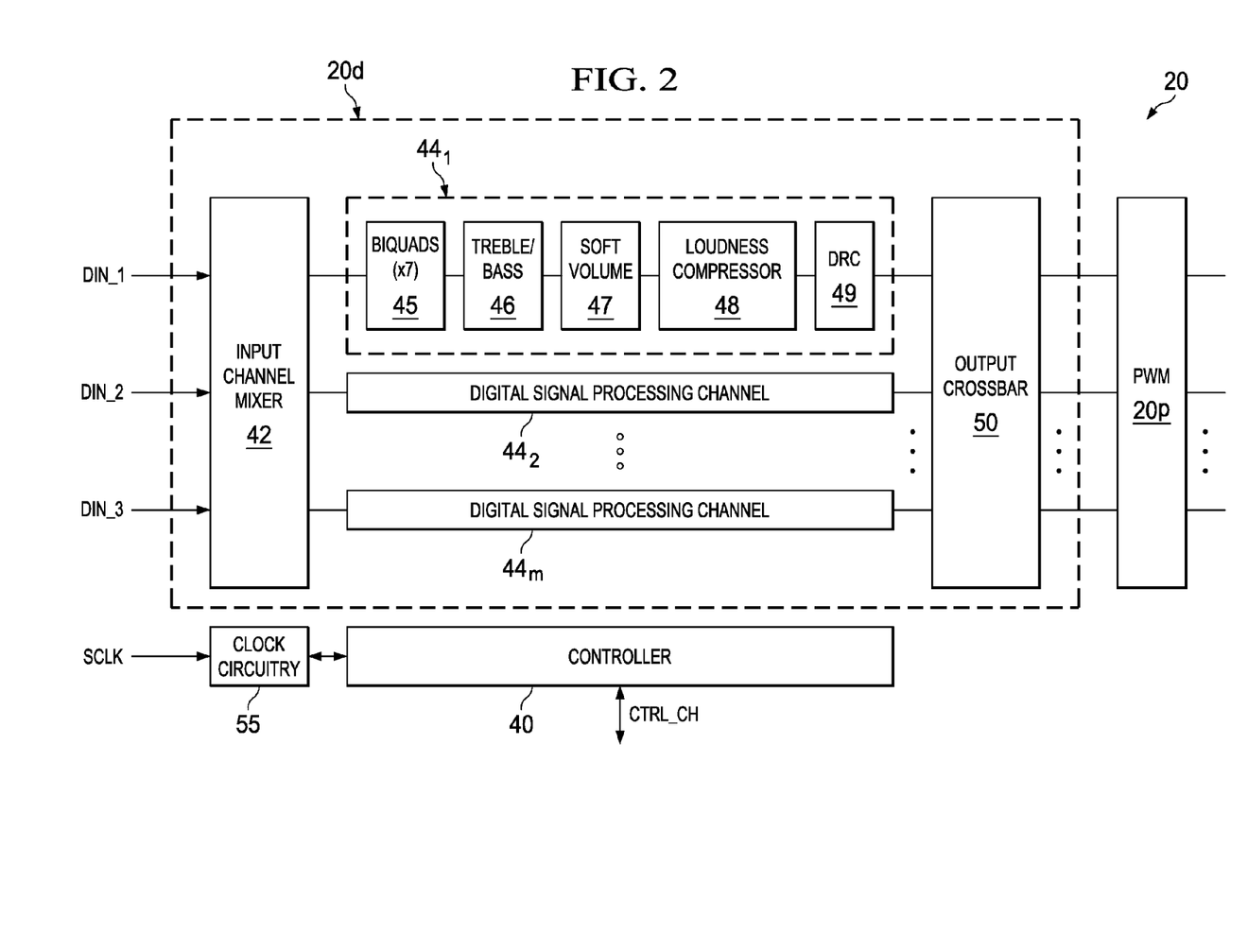
FIG. 2 is an electrical diagram, in block form, of a digital audio processor in the system of FIG. 1, constructed according to the preferred embodiment of the invention.

FIG. 2 illustrates, in more detail, the construction of digital audio PWM processor 20, specifically digital audio processing function 20d therein. Digital audio processing function 20d includes input channel mixer 42, which receives multiple incoming audio channels from input multiplexer 16 of FIG. 1, and mixes each of the multiple input channels to a selected digital processing channel 44, under the control of controller 40. As shown in the example of FIG. 2, digital audio PWM processor 20 includes multiple digital signal processing channels 44, each for applying digital filters and other signal processing algorithms and functions to its assigned audio channel, or to multiple channels in a time-multiplexed fashion, if enabled. In this example, m digital signal processing channels $44_1$ through $44_m$ are implemented, with the number m depending upon the desired capability of digital audio PWM processor 20, which may number from two or three, to as many as eight or more. Typically, the number of digital signal processing channels 44 that are implemented in digital audio processor 20p will correspond to the number of speaker channels to be driven by receiver 21, which in this example is four.

The construction of digital signal processing channel $44_1$ will be described in detail, by way of example. It is contemplated that some or all of digital signal processing channels 44 are identically configured, although one or more of channels 44 may have special functionality, such as in the case of an extremely low bass channel for driving a sub-woofer, or in the case of a rear channel in a surround-sound system. According to this embodiment of the invention, biquad block 45 is first applied to the input digital audio signal from mixer 42. Biquad block 45 includes a series of biquad, second-order IIR, digital filters, executable in cascade, for performing parametric speaker equalization or "voicing", implementation of graphic equalizer presets, and the like. Treble/bass function 46 receives the output of biquad block 45, and applies treble and bass adjustment as selected by the user or under program control, via controller 40. The remainder of digital signal processing channel $44_1$ includes soft volume block 47 for applying precision soft volume control, loudness compensation block 48 for applying volume-dependent spectral shape on the audio signal to boost bass frequencies at low volume, and dynamic range compression (DRC) function 49 for shaping the spectrum of the output signal according to a programmable linear frequency relationship.

Additional signal processing functions, such as background noise floor compensation or noise squelch, center or sub-woofer channel synthesis, programmable dither, peak limiting and clipping, programmable channel delay, and the like may also be implemented.

It is contemplated that the signal processing functions of digital signal processing functions are preferably implemented as software routines executable by a digital signal processor (DSP) integrated circuit or core, having sufficient capability to execute the desired operations at the necessary data rate. In this implementation, program and data memory resources are provided either within the DSP integrated circuit, or external to and accessible by the DSP integrated circuit or core. It is contemplated that DSP circuitry such as described in U.S. Patent Application Publication US 2005/0076073, entitled "Biquad Digital Filter Operating at Maximum Efficiency", assigned to Texas Instruments Incorporated, and incorporated herein by this reference, is an example of a suitable hardware architecture according to the preferred embodiment of the invention. Of course, custom or semi-custom logic circuitry may also be used to perform these operations within digital audio processing function 20d.

Output crossbar 50 receives each of the digital output data streams from digital signal processing channels $44_1$ through $44_m$, and routes the processed channels to the desired inputs of PWM function 20p in this example. Typically, the outputs of digital audio processor 30 are digital serial outputs, in PCM format as mentioned above. Output crossbar 50 thus permits programmable or user control of the assignment of channels to outputs, enabling a wide degree of freedom in the operation of the audio system.

Controller 40 in digital audio PWM processor 20 controls the operation of digital audio PWM processor 20 in response to predesigned control code and in response to user inputs. Controller 40 is preferably realized by way of programmable logic of a suitable architecture for executing these control functions and the particular functions described herein in connection with the preferred embodiment of the invention. The general control functions performed by controller 40 in controlling the operation of digital audio PWM processor 20 will not be described in detail, it being understood that those skilled in this art having reference to this specification will be readily able to implement such control functionality, without undue experimentation.

Additional control and functional circuitry may also be included within digital audio PWM processor 20, as useful in digital audio processing. For example, clock circuitry 55 may receive clock signals from external to digital audio PWM processor 20, such clocks including a system master clock, a sample clock that is synchronous with the incoming digital audio datastream; in turn, clock circuitry 55 preferably includes phase-locked loops, frequency dividers, and the like to generate the appropriate clock signals for use by digital audio processing function 20d and PWM function 20p, including a high-speed clock for the pulse-width-modulation function, PWM frame clock signals, and the like. Other control functions, not shown in FIG. 2 for the sake of clarity, may also be included within controller 40.

Figure 3:
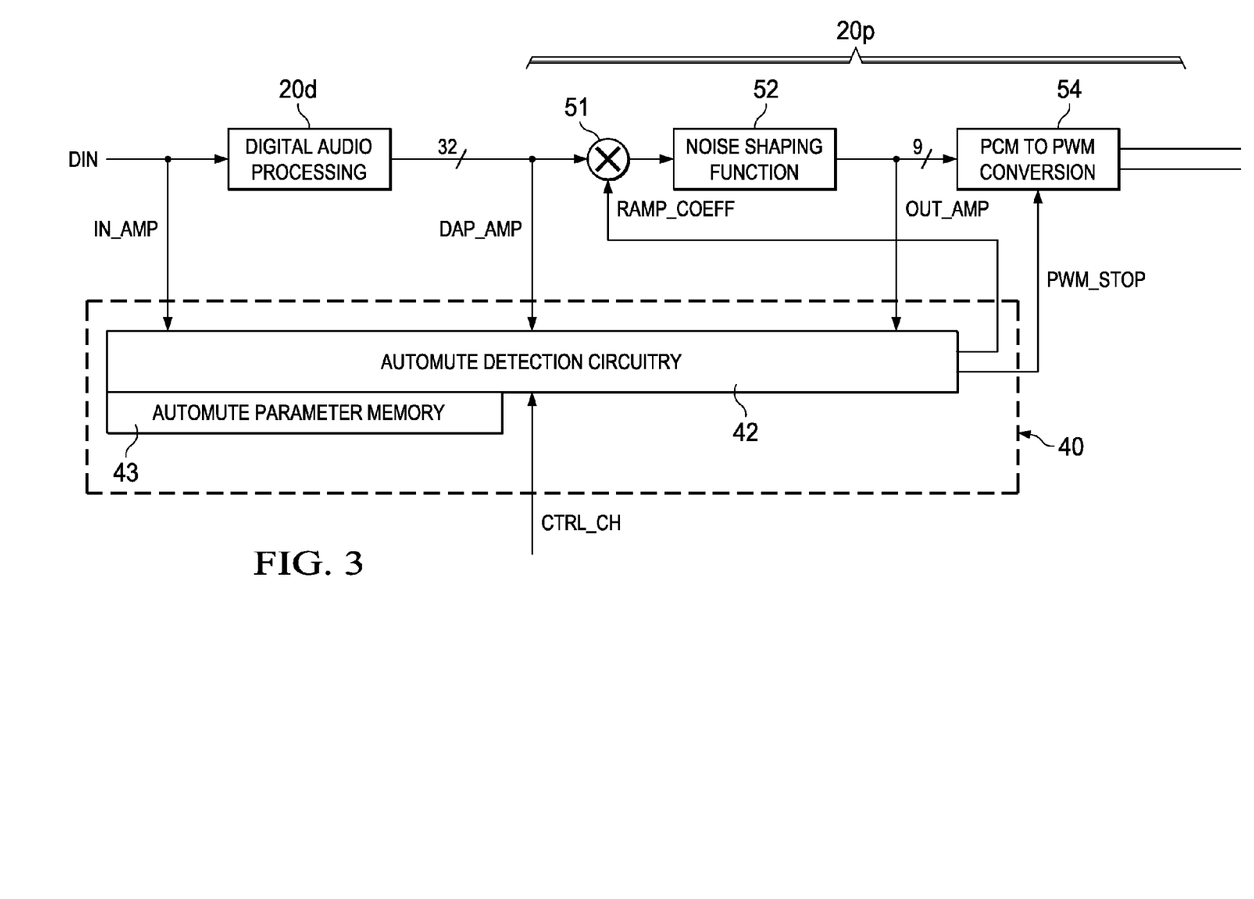
FIG. 3 is an electrical diagram, in block form, of digital signal processing functions associated with one of the channels of the multiple-channel digital audio processor of FIG. 2, constructed according to the preferred embodiment of the invention.

FIG. 3 illustrates the construction of digital audio PWM processor 21 for one of the multiple channels supported by receiver 21, in the context of the preferred embodiment of the invention. It will be understood, by those skilled in the art having reference to this specification, that the functional flow of FIG. 3 corresponds to each of the multiple channels, and as such can be readily implemented on a channel-by-channel basis. As shown in FIG. 3 and as discussed above relative to FIG. 2, digital audio input signals on line DIN are received by digital audio processing function 20d, which is programmed to process these audio signals in the manner discussed above relative to FIG. 2. According to the preferred embodiment of the invention, a measure of the amplitude of the incoming digital audio input signal is forwarded, on lines IN_AMP, to automute detection circuitry 42 in controller 40. The amplitude signal on lines IN_AMP may be simply the incoming digital PCM audio signals on lines DIN themselves, from which automute detection circuitry 41 deduces the amplitude of the input signal; alternatively, some subset (most significant bits) of the PCM input signal or another measure of the amplitude may be communicated on lines IN_AMP.

As shown in FIG. 3, the output of digital audio processor is forwarded to PWM function 20p, again on parallel data lines, preferably in the form of a PCM datastream. According to this embodiment of the invention, PWM function 20p includes gain stage 50, which applies a volume ramp control as will be described in further detail below. The output of gain stage 51 is applied to noise shaping function 52. Interpolation filtering to upsample the datastream, and sample rate conversion, may also be applied prior to noise shaping function 52, if desired. Noise shaping function 52 applies conventional spectral noise-shaping, for example by way of a sigma-delta modulator, resulting in quantization noise that is high-pass shaped to minimize the effects of quantization noise in audible frequencies; noise shaping function 52 may also apply digital non-linear correction, for example by way of Hammerstein modeling and correction that effectively includes simple power expansion of the input signal followed by linear and time-invariant digital filters. This digital non-linear correction can effectively pre-compensate for distortion that otherwise may be generated in the conversion of variable-amplitude, fixed-duration, PCM signals into fixed-amplitude, variable-duration, PWM signals by PCM to PWM conversion function 54, to which the output of noise shaping function 52 is applied, for example by way of a nine-bit bus. PCM to PWM conversion function 54 converts the PCM signals from noise shaping function 52 into PWM control signals, to be applied to power stage 22 for the corresponding channel, as discussed above relative to FIG. 2.

As mentioned above, the amplitude of the input signal applied to digital audio processor 20p is communicated, by way of bus IN_AMP, to automute detection circuitry 42. As is also shown in FIG. 3, the amplitude of the output of digital audio processor 20p is applied to automute detection circuitry 42 by way of bus DAP_AMP. And the amplitude of the output of noise shaping function 52 is similarly communicated to automute detection circuitry 42 via lines OUT_AMP. In each case, the amplitude signals on lines IN_AMP, DAP_AMP, OUT_AMP may simply be the full communicated digital signals themselves, from which automute detection circuitry 42 can deduce the amplitude. The PCM values on lines IN_AMP, DAP_AMP, OUT_AMP may be in the form of signed digital values, representative of positive and negative polarity excursions around a DC reference level (e.g., zero), or may instead correspond to an unsigned digital value. Alternatively, because these signals are in PCM format according to this embodiment of the invention, the most significant bits of the datastreams may be communicated on lines IN_AMP, DAP_AMP, OUT_AMP (taking into account whether the digital PCM values are signed or unsigned). Further in the alternative, circuitry (not shown) may be provided that detects and communicates some other measure of the amplitude of the digital signals at these points in digital audio PWM processor 20.

As shown in FIG. 3, automute detection circuitry 42 within controller 40 is coupled to automute parameter memory 43, which stores threshold and time-out values, as well as control information, used by automute detection circuitry 42 according to the preferred embodiment of the invention. The threshold and time-out values stored in automute parameter memory 43, as well as the control information, are preferably loaded from externally to digital audio processor 20 by way of a serial datastream from system microcontroller 30 over serial interface CTRL_CH, which is preferably realized as a I²C digital serial interface as mentioned above.

According to the preferred embodiment of the invention, automute detection circuitry 42 generates automute (and unmuting) signals in response to comparisons of the measured signal amplitudes on lines IN_AMP, DAP_AMP, OUT_AMP to respective threshold values stored in automute parameter memory 43, and with respect to programmed time durations that are also stored in automute parameter memory 43. In response to these inputs and stored thresholds, automute detection circuitry 42 issues a control signal on line RAMP_COEFF to gain stage 51, to effect the ramping down (or ramping up, in an unmuting event) of the amplitude of the signal applied to noise shaping function 52, and a control signal on line PWM_STOP to PCM to PWM conversion function 54, responsive to which pulse-width-modulation is halted. The particular events and manner in which these control signals are issued will be described in further detail below.

Figure 4:
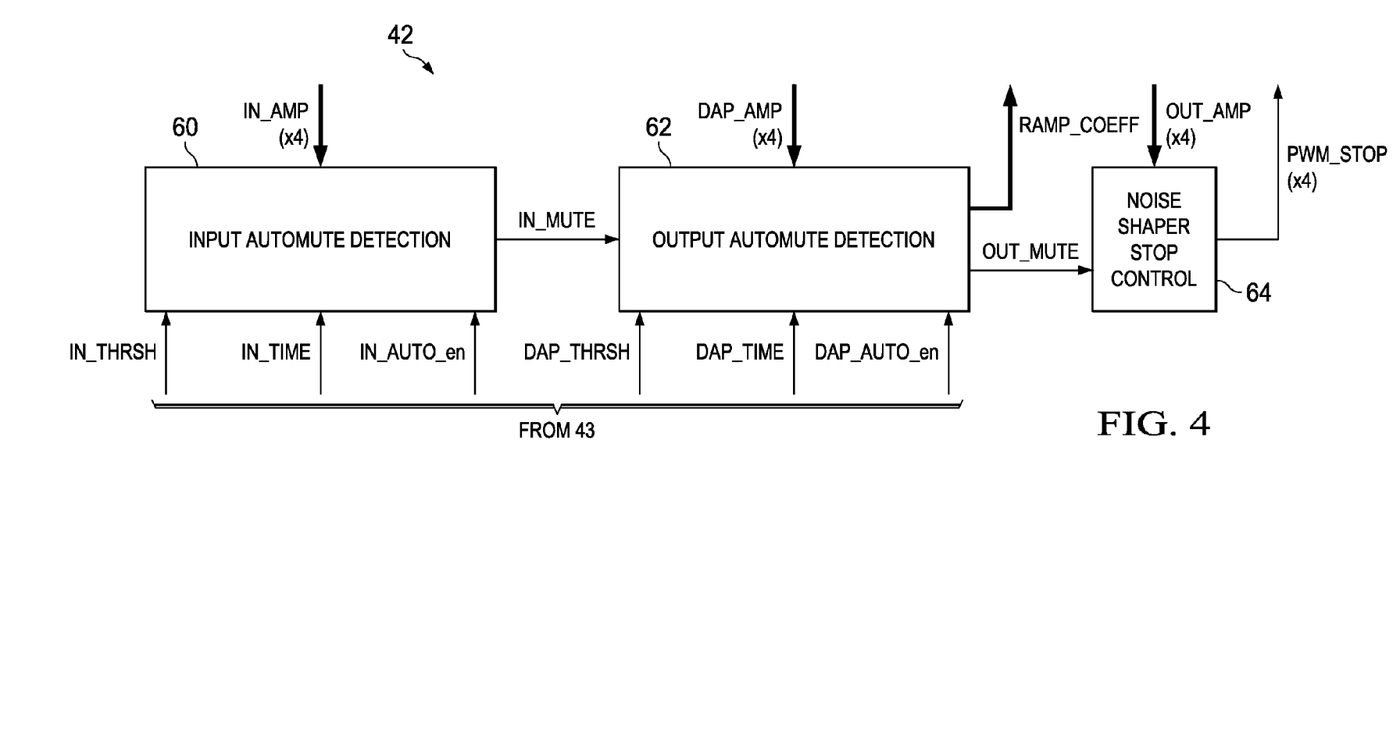
FIG. 4 is an electrical diagram, in block form, of automute detection circuitry in a digital audio processor constructed according to the preferred embodiment of the invention.

Referring next to FIG. 4, the arrangement of automute detection circuitry 42 will now be described. It is contemplated that automute detection circuitry 42 may be constructed by way of conventional logic circuitry, either of the sequential or combinational type, or alternatively by way of a software routine executed by a programmable processor, all such approaches as known in the art and available for utilization by those skilled in the art having reference to this specification.

As shown in FIG. 4, automute detection circuitry 42 includes input automute detection function 60, which receives an input-level threshold value on lines IN_THRSH and an input-level time value on lines IN_TIME, both from automute parameter memory 43. The input-level threshold value on lines IN_THRSH is a binary representation of the amplitude threshold below which an automuting operation may be initiated, as will be described below. The input-level time value received on lines IN_TIME from automute parameter memory 43 indicates a length of time that is to elapse after the receipt of an input amplitude on lines IN_AMP that is below the input-level threshold value on lines IN_THRSH, before action is to be taken toward the muting function, as will be described below. According to the preferred embodiment of the invention, it is contemplated that typical times for the input-level time value are on the order of from about 1 msec to about 120 msec. Input automute detection function 60 also receives an enable signal, on line IN_AUTO_en from a control register in automute parameter memory 43, or alternatively from logic circuitry elsewhere in controller 40. Input automute detection function 60 receives input signal amplitude values on lines IN_AMP from the input to digital audio processing function 20d, for each of the channels supported by digital audio processing function 20d (four channels, in this example).

Input automute detection function 60 is preferably constructed as logic circuitry for generating, when enabled, an output signal on line IN_MUTE to output automute detection function 62 in response to a comparison of one or more of the amplitude values on lines IN_AMP to the input-level threshold value communicated on lines IN_THRSH, and to the elapsing of a time period corresponding to the input-level time value communicated on lines IN_TIME. For example, input automute detection function 60 may be constructed to include comparator circuitry, a timer, and enabling logic; alternatively, input automute detection function 60 may be constructed by way of sequential logic, if preferred for a particular application. As will be described in further detail below relative to the operation of automute detection circuitry 42 according to the preferred embodiment of the invention, input automute detection function 60 asserts an output signal on line IN_MUTE in response to one or more of the input amplitude values indicating an amplitude below the input-level threshold value, for a time longer than the input-level time value.

Output automute detection function 62 receives the signal from input automute detection function 60 on line IN_MUTE, as mentioned above. In addition, similarly as input automute detection function 60, output automute detection function 62 receives an output-level threshold value on lines DAP_THRSH and an output-level time value on lines DAP_TIME, both from automute parameter memory 43. As before, the output-level threshold value on lines DAP_THRSH is a binary representation of the amplitude threshold below which an automuting operation may be initiated, and the output-level time value received on lines DAP_TIME indicates the length of time that is to elapse after the receipt of an amplitude on lines DAP_AMP below the output-level threshold value on lines DAP_THRSH before muting action is to be taken. Examples of a preferred range of output-level time values extend from about 1 msec to about 120 msec. Output automute detection function 60 receives an enable signal, on line DAP_AUTO_en from a control register in automute parameter memory 43, or alternatively from logic circuitry elsewhere in controller 40. Output automute detection function 60 receives signal amplitude values from the output of digital audio processing function 20d, for each of the (e.g., four) channels supported by digital audio processing function 20d, on lines DAP_AMP.

According to this embodiment of the invention, output automute detection function 62 is constructed as combinational or sequential logic for performing two functions. A first of these functions is similar to that of input automute detection function 60, in that output automute detection function 62, when enabled on line DAP_AUTO_en, generates an output signal on line OUT_MUTE to noise shaper stop control function 64 in response to a comparison of one or more of the amplitude values on lines DAP_AMP to the output-level threshold value communicated on lines DAP_THRSH, and to the elapsing of a time period corresponding to the output-level time value communicated on lines DAP_TIME. According to the preferred embodiment of the invention, output automute detection function 60 asserts this signal on line OUT_MUTE in response to one or more of the amplitude values indicating an amplitude below the output-level threshold value for a time longer than the output-level time value.

According to a second function in this preferred embodiment of the invention, output automute detection function 62 also generates a volume ramp coefficient value to gain stage 51, on lines RAMP_COEFF, in response to the signal received on line IN_MUTE from input automute detection function 60. In this example, as will be described in further detail below, the activation of the signal on line IN_MUTE in the absence of an asserted signal on line OUT_MUTE indicates that the amplitude of the input signal to digital audio processing function 20d has been below the threshold, but that the filters within digital audio processing function 20d still retain energy at its output. In this event, the value on line RAMP_COEFF communicates a signal that causes gain stage 51 to rapidly, yet smoothly, ramp the gain at its output toward zero, thus initiating an automute state. The value on line RAMP_COEFF may correspond to a slope, or rate of change, of the volume ramp, or a time value over which gain stage 51 is to ramp the volume level, or simply a signal indicating that gain stage 51 execute a pre-designed volume ramp operation.

Accordingly, as in the case of input automute detection function 60, output automute detection function 62 is also preferably constructed as combinational or sequential logic circuitry for performing these functions. In the combinational case, function 26 would include comparator circuitry, a timer, enabling logic, and logic for deriving the desired coefficient value to be applied to lines RAMP_COEFF; in the sequential logic implementation, functions similar to these would be realized in a state machine or the like.

Noise shaper stop control function 64, as shown in FIG. 4, receives the signal on line OUT_MUTE from output automute detection function 62, and amplitude values from the output of noise shaping function 52 (FIG. 3) on lines OUT_AMP, for each of the channels (e.g., four) supported by receiver 21. Noise shaper stop control function 64 drives an output signal on one line PWM_STOP for each of the channels, and that is forwarded to PCM-to-PWM conversion function 54 (FIG. 3) for that channel. In operation, according to this embodiment of the invention, noise shaper stop control function 64 asserts a signal on one or more of lines PWM_STOP in response to an asserted signal on line OUT_MUTE from output automute detection function 62, at a suitable time as indicated by the output of noise shaping function 52 on lines OUT_AMP. An example of noise shaper stop control function 64 is described in previously-referenced U.S. Patent Application Publication No. US 2004/0017854, commonly assigned herewith and incorporated herein by this reference.

Figure 5A:
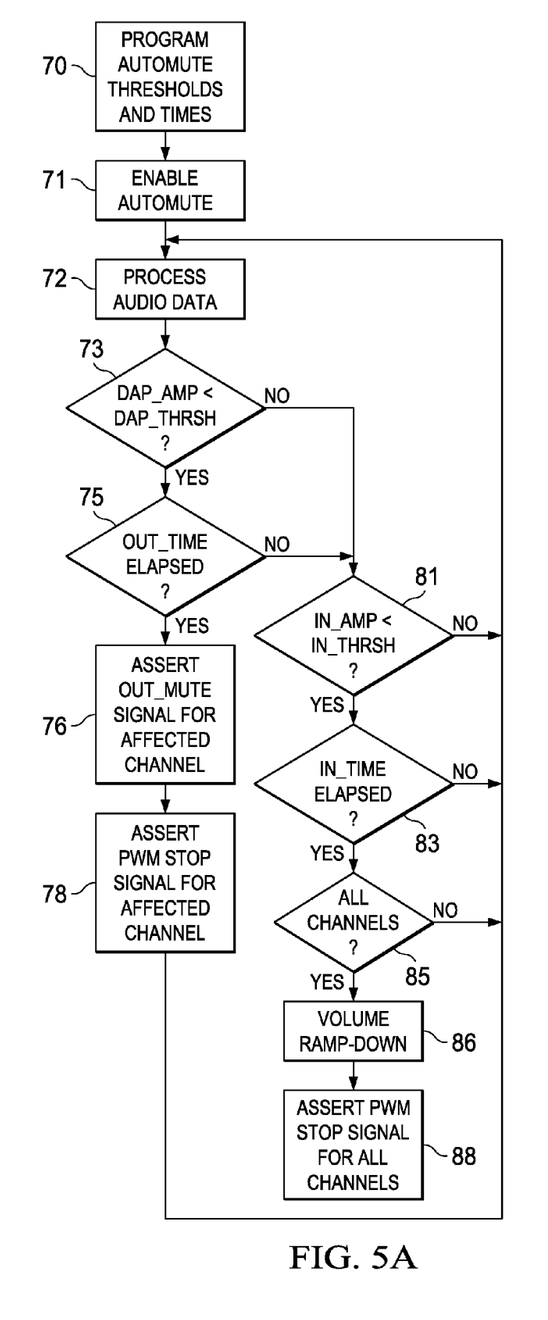
FIG. 5a is a flow diagram illustrating the operation of the automute detection circuitry in entering an automute state, according to the preferred embodiment of the invention.

Referring now to FIG. 5a in combination with FIG. 4, the operation of automute detection circuit 42 in performing an automute operation according to the preferred embodiment of the invention, will now be described. The process can be considered to begin with process 70, in which the threshold and time duration values are programmed into automute detection circuit 42 for use in the automuting process. In the preferred embodiment of the invention described above, these values are programmed into automute parameter memory 43 by system controller 30 (FIG. 1), for example by communicating the input-level and output-level threshold values, and the input-level and output-level time values, to controller 40 over I$^2$C digital serial interface CTRL_CH. Controller 40 then stores these values in the appropriate locations of automute parameter memory 43, and communicates those values to input automute detection function 60 and output automute detection function 62, over the appropriate ones of lines IN_THRSH, IN_TIME, DAP_THRSH, DAP_TIME, as described above. In process 71, system controller 30 enables the automute operation, for example by writing a control word to controller 40 over interface CTRL_CH; within controller 40, the enable signals are communicated to input automute detection function 60 and output automute detection function 62 over lines IN_AUTO_en, DAP_AUTO_en, respectively. Automute detection circuitry 42 is then ready for initiating an automute operation in response to the various amplitude levels within digital audio PWM processor 20.

Meanwhile, digital audio processing function 20*d* and PWM function 20*p* operate to process the digital audio data in process 72, in the manner described above and as well-known in the art. It is contemplated that the automute detection process can be executed in substantially a real-time manner (e.g., on a sample-by-sample basis within each sampling period), and as such the automute process can be considered as operating on each sample amplitude value for each channel. Alternatively, the automute detection process can lag the actual digital datastream values, as the automute detection is not in the data path of the digital audio data and need not be executed in real-time. In addition, while the automute process will be described by way of a linear or sequential process as shown in FIG. 5*a*, the actual implementation of the automute initiation process need not be carried out in this specific sequence, or indeed in any sequence (i.e., many of the operations can be carried out in parallel). The flow diagram of FIG. 5*a* is presented by way of an example only, to provide clarity in the description in the operation of automute detection circuitry 42 according to the preferred embodiment of the invention.

As part of process 72, each sample of digital audio data is processed by input automute detection function 60 and output automute detection function 62. As discussed above, input automute detection function 60 compares the amplitude value at the input to digital audio processing function 20*d*, for each channel, to the output level threshold value received on lines IN_THRSH. Meanwhile, input automute detection function 60 compares the amplitude value for each channel at the output of digital audio processing function 20*d* against the output-level threshold value received on lines DAP_THRSH. Considering the propagation delay within digital audio processing function 20*d*, the digital audio sample processed by output automute detection function 62 will likely be an earlier-in-time sample than that processed by input automute detection function 60.

Referring back to FIG. 5*a*, automute processing continues with decision 73, in which the result of the processing by output automute detection function 62 determines whether there has been an event that is to cause initiation of automute. Specifically, according to this embodiment of the invention and as described above, output automute detection function 62 determines whether the amplitude at the output of digital audio processing function 20*d*, for any of the channels, is below the threshold value communicated on lines DAP_THRSH. If not, decision 81 determines whether input automute detection function 60 has detected an amplitude, for any of its channels and at the input to digital audio processing function 20*d*, that is below the input-level threshold value communicated on lines IN_THRSH. If not (decision 81 is NO), control returns to process 72 in which the next sample of digital audio data is processed.

Referring back to decision 73, if the amplitude of any of the channels at the output of digital audio processing function 20*d* is below the threshold value communicated on lines DAP_THRSH (decision 73 is YES), output automute detection function 62 initiates its timer function to begin counting toward the programmed output-level time value received on lines DAP_TIME. Control passes to decision 75 to determine whether the programmed output-level time value has yet elapsed. If not (decision 75 is NO), control passes to decision 81 for evaluation of the result from input automute detection function 60, as mentioned above.

If the output-level time period has elapsed, however (decision 75 is YES), then an automute condition at the output of digital audio processing function 20*d* is appropriate. Decision 75 preferably refers to the particular channel having the low output amplitude, so that the elapse of the time period is associated with the same channel having been at the low amplitude for the entire time period. In this event, output automute detection function 62 has determined that at most a very low level of energy is present in the filters of digital audio processing function 20*d* for the affected channel, and so the output can be forced to zero without causing substantial audible noise. According to this preferred embodiment of the invention, output automute detection function 62 then asserts a signal on its line OUT_MUTE to noise shaper stop control 54, in process 76. Noise shaper stop control 54 then analyzes the output data from noise shaping function 52, and asserts a signal on line PWM_STOP to stop pulse-width-modulation by PCM-to-PWM conversion function 54 for the affected channel at time appropriate for the shutdown, as described in the above-incorporated U.S. Patent Application Publication No. US 2004/0017854, in process 78. Because not all channels have been automuted as a result of processes 76, 78, control returns to process 72 for the continuing processing of digital audio data samples.

Referring back to decision 81, if input automute detection function 60 detects that the amplitude of one or more of the channels at the input to digital audio processing function 20*d* is below the input-level threshold communicated on lines IN_THRSH (decision 81 is YES), the state of the timer function in input automute detection function 60 is evaluated. As before, this timer function begins counting with an initial determination of a low amplitude signal. If the timer function has not yet reached the input-level time value communicated on lines IN_TIME (decision 83 is NO), then control returns to process 72.

According to the preferred embodiment of the invention, it is preferred that automuting due to low input amplitude is to occur only when all channels are receiving a low input amplitude. As such, if the programmed time has elapsed (decision 83 is YES), decision 85 is then executed to determine whether this condition of low input signal amplitude exists for all channels. If not (decision 85 is NO), control returns to process 72 for the processing of more digital audio data. In the alternative, if desired, the input level automuting detected by input automute detection function 60 may be effected on a channel-by-channel basis.

If all channels have met the automute criteria of their respective input amplitudes to digital audio processing function 20*d* being below the input-level threshold for the specified time (decision 85 is YES), input automute detection function 60 asserts a signal on line IN_MUTE to output automute detection function 62, in process 86. In response, also in process 86, output automute detection function 62 senses this asserted signal, derives a volume ramp-down coefficient value or values for a fast yet smooth ramping down of the output volume, and applies this value or values on lines COEFF_RAMP to gain stage 51. In addition, output automute detection function 62 notifies noise shaper stop control function 64 of this event by asserting a signal on line OUT_MUTE, which in turn stops PCM-to-PWM conversion function 54 at the appropriate time following the volume ramping of process 86. In process 88, noise shaper stop control function 64 asserts a signal on line PWM_STOP upon the output of noise shaping function 52, communicated on lines OUT_AMP, reaching a suitable state, in process 88. Digital audio PWM processor 20 is thus in an automute state, for all of its channels.

The process of exiting an automute state on all channels as initiated by input automute detection function 60, according to the preferred embodiment of the invention, will now be described relative to FIG. 5*b*. While in the automute state, digital audio PWM processor 20 continues to process incoming digital audio data in process 90, during which input automute detection function 60 continues to compare the amplitude of the signal at the input to digital audio processing function 20*d* with the specified input-level threshold received on lines IN_THRSH. According to the preferred embodiment of the invention, the input amplitude comparison for exiting the automute state is made against a higher threshold value than the comparison for entering automute. For example, the comparison for exiting automute may add a fixed or programmable guard value $\epsilon$ (e.g., 6 dB) to the programmed input-level threshold value received on lines IN_THRSH. This hysteresis avoids the vulnerability of digital audio PWM processor 20 oscillating between automute and unmuted states for small changes (or quantization noise) in input signal amplitude levels. Alternatively, the application of guard value $\epsilon$ may be a programmable option, for example selected by way of setting a flag bit in a control register. In either case, the result of this comparison is evaluated in decision 91; if no channel is receiving digital audio at above the threshold level (decision 91 is NO), control returns to process 90 for processing of the next sample or data block.

Figure 5B:
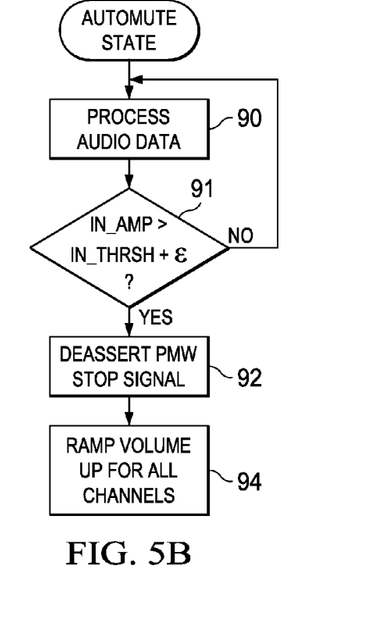
FIG. 5b is a flow diagram illustrating the operation of the automute detection circuitry in exiting an automute state, according to the preferred embodiment of the invention.

Upon the amplitude of the input signal exceeding the input-level threshold for at least one channel (decision 91 is YES), input automute detection function 60 deasserts its signal on line IN_MUTE, beginning deassertion process 92 of FIG. 5*b*. In response to the deasserted line IN_MUTE, output automute detection function 62 releases its output signal on line OUT_MUTE, and noise shaper stop control 64 in turn releases the signal on line PWM_STOP to PCM-to-PWM conversion function 54, enabling pulse-width-modulation to begin again on all channels. In process 94, output automute detection function 62 also derives and applies a volume ramp coefficient value or values to its output lines COEFF_RAMP to gain stage 51, effecting a relatively fast yet smooth ramping up of volume upon the digital output of digital audio processing function 20*d* as applied to PWM function 20*p*. Following the completion of this volume ramp process 94, digital audio PWM processor 20 operates in the normal manner, in effect returning to data processing process 72 (FIG. 5*a*) to await and detect further automute events.

In the event that one or more channels are automuted by output automute detection function 64 in process 78, the automute condition for those channels may be exited by continued operation of output automute detection function 64. Upon the output of digital audio processing function 20*d* for a currently automuted channel exceeding the output-level threshold on lines DAP_THRSH (optionally, with the application of a guard value $\epsilon$), output automute detection function 62 may enable the pulse-width-modulation of that channel, by releasing the signal on one of its lines OUT_MUTE to noise shaper stop control function 64, which in turn releases its PWM_STOP signal for that channel at an appropriate time.

The automuting process according to the preferred embodiment of the invention is particularly beneficial in modern digital audio systems. Specifically, the automuting according to this invention responds rapidly by placing the digital receiver into an automute state upon the input signal level going toward a low level, but without generating audible artifacts as a result of energy remaining in long time constant filters after the input signal is gone. The elimination of audible artifacts is accomplished by smoothly, yet rapidly, ramping down the output from digital filter blocks upon entry into automute, avoiding instantaneous output clamping when energy remains in those filters. The use of multiple automute detection circuits provides excellent flexibility in this operation, by permitting substantially immediate muting if the digital filters already have little stored energy. Hysteresis may be provided in the entry into and exit from automute, for stability.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An apparatus comprising:
    digital signal processor that applies at least a first digital filter to digital signals corresponding to a first audio channel to generate processed signals;
    a first gain stage coupled to the output of the digital signal processor that applies volume control to the processed signals;
    pulse-width-modulation (PWM) circuitry coupled to the output of the first gain stage, wherein the PWM circuitry includes a noise shaping function having an input coupled to the output of the first gain stage and the applies spectral noise shaping to the signal corresponding to the first audio channel; and
    automute detection circuitry having:
        a first input coupled to an input to the digital signal processor;
        a second input coupled to the output of the digital signal processor;
        a volume ramp output coupled to the first gain stage;
        a stop output coupled to the PWM circuitry, wherein the stop output controls the first gain stage to ramp a volume of the signals corresponding to the first audio channel responsive to an amplitude of digital signals corresponding to the first audio channel at the input of the digital signal processor being below a first threshold level, and wherein the stop output disables PWM circuitry for the first audio channel responsive to an amplitude of digital signals corresponding to the first audio channel at the output of the digital signal processor being below a second threshold level; and
        a noise shaper stop control circuit having an input coupled to the output of the noise shaping circuit and an output coupled to the stop output, wherein the noise shaper generates a stop signal responsive to a signal state at the output of the noise shaping circuit.

2. The apparatus of claim 1, wherein the automute detection circuitry controls the first gain stage to ramp the volume of the signals corresponding to the first audio channel responsive to the amplitude of digital signals corresponding to the first audio channel at the input of the digital signal processing circuitry being below the first threshold level for a first selected time duration, and wherein the automute detection circuitry disables the PWM circuitry for the first audio channel responsive to the amplitude of digital signals corresponding to the first audio channel at the output of the digital signal processing circuitry being below the second threshold level for a second selected time period.

3. The apparatus of claim 2, wherein the automute detection circuitry disables the PWM circuitry after the first gain stage ramps the volume of the signals corresponding to the first audio channel.

4. The apparatus of claim 1, wherein the automute detection circuitry further comprises an automute parameter memory coupled to the automute detection circuitry, that stores digital values corresponding to the first and second threshold levels and first and second selected time durations.

5. The apparatus of claim 4, wherein the automute detection circuitry further comprises:
   an input automute detection circuit having:
      an input coupled to an input to the digital signal processing circuitry;
      inputs coupled to the automute parameter memory to receive the first threshold value and the first selected time period value; and
      an output, wherein the input automute detection circuit asserting a signal at its output responsive to the amplitude of digital signals corresponding to the first audio channel at the input of the digital signal processing circuitry being below the first threshold level for the first selected time duration; and
   an output automute detection circuit having:
      an input coupled to the output of the input automute detection circuit;
      an input coupled to the output of the digital signal processing circuitry;
      an input coupled to the automute parameter memory to receive the second threshold value and the second selected time period value; and
      a first output coupled to the noise shaper stop control circuit, wherein the output automute detection circuit that asserts a signal at its first output responsive to the amplitude of digital signals corresponding to the first audio channel at the output of the digital signal processing circuitry being below the second threshold level for the second selected time duration.

6. The processor apparatus of claim 5, wherein the output automute detection circuit further comprises a second output that applies a signal on the volume ramp output responsive to the input automute detection circuit asserting a signal at its output.

7. The apparatus of claim 1, wherein the digital signal processing circuitry applies at least a first digital filter to digital signals corresponding to a plurality of audio channels and wherein the automute detection circuitry controls the first gain stage to ramp a volume of the signals corresponding to the first audio channel responsive to an amplitude of digital signals corresponding to each of the plurality of audio channels at the input of the digital signal processing circuitry being below the first threshold level for a first selected time duration.

8. The apparatus of claim 7, wherein the automute detection circuitry disables the PWM circuitry for one of the plurality of audio channels responsive to an amplitude of digital signals corresponding to the one of the plurality of audio channels at the output of the digital signal processing circuitry being below the second threshold level for a second selected time duration.

9. The apparatus of claim 7, wherein the automute detection circuitry disables the PWM circuitry for each of the plurality of audio channels after the first gain stage ramps the volume.

10. An apparatus comprising:
   a digital audio processor that applies a digital filter to a first audio channel;
   a gain stage that receives a signal from the digital audio processor;
   a noise shaping function that receives a signal from the gain stage;
   a PWM converter that is coupled to the noise shaping function; and
   automute detection circuitry including:
      memory;
      an input automute detection circuit that is coupled to the memory and the digital audio processor, wherein the input automute detection circuit asserts a first signal responsive to an amplitude of digital signals corresponding to the first audio channel at the input of the digital signal processing circuitry being below a threshold level for a selected time duration;
      an output automute detection circuit that is coupled to the input automute detection circuit, the digital audio processor, the gain stage, and the memory, wherein the output automute detection circuit receives the first signal from the input detection circuit; and
      a noise shaper stop control circuit that is coupled to the noise shaping function, the output automute detection circuit, and the PWM converter, wherein the noise shaper generates a stop signal for the PWM converter responsive to a signal state output from the noise shaping circuit.

11. The apparatus of claim 10, wherein the digital audio processor further comprises:
   a mixer;
   a plurality of processing channels, wherein each processing channel is coupled to the mixer; and
   an output crossbar that is coupled to each processing channel.

12. The apparatus of claim 10, wherein the apparatus further comprises:
   a plurality of audio sources; and
   a multiplexer that is coupled to each of the audio sources and to the digital audio processor.

13. The apparatus of claim 12, wherein the apparatus further comprises:
   a plurality of power stages, wherein each power stage is coupled to the PWM converter; and
   a plurality of speakers, wherein each speaker is coupled to at least one of the power stages.

* * * * *